(12) United States Patent
Ngo et al.

(10) Patent No.: US 6,333,218 B1
(45) Date of Patent: Dec. 25, 2001

(54) METHOD OF ETCHING CONTACTS WITH REDUCED OXIDE STRESS

(75) Inventors: Minh Van Ngo, Fremont; Jayendra Bhakta, Sunnyvale, both of CA (US); Paul Besser, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/501,995

(22) Filed: Feb. 11, 2000

(51) Int. Cl.[7] .................................................. H01L 21/8238
(52) U.S. Cl. .......................... 438/221; 438/296; 438/437; 438/788
(58) Field of Search ..................................... 438/248, 424, 438/435, 437, 221, 778, 787, 788, 296

(56) References Cited

U.S. PATENT DOCUMENTS

| | | |
|---|---|---|
| 4,656,497 | 4/1987 | Rogers et al. . |
| 4,952,524 | 8/1990 | Lee et al. . |
| 5,581,110 | 12/1996 | Razouk et al. . |
| 6,191,004 | * 2/2001 | Hsiao . |
| 6,211,040 | * 4/2001 | Liu et al. . |

* cited by examiner

Primary Examiner—Tuan H. Nguyen

(57) ABSTRACT

A method for manufacturing a semiconductor device forms a trench of a trench isolation region in a portion of a top surface of a semiconductor substrates. Oxide is deposited as a trench liner in the trench using high temperature high density plasma (HDP) deposition. As the high temperature HDP oxide deposition is a stress neutral process, stress defects in an interface between the silicon substrate and the oxide layer are avoided, so that subsequent etching steps in a local interconnect process are less likely to overreach at the interface. This reduces the possibility of junction leakage when the local interconnect is formed.

14 Claims, 5 Drawing Sheets

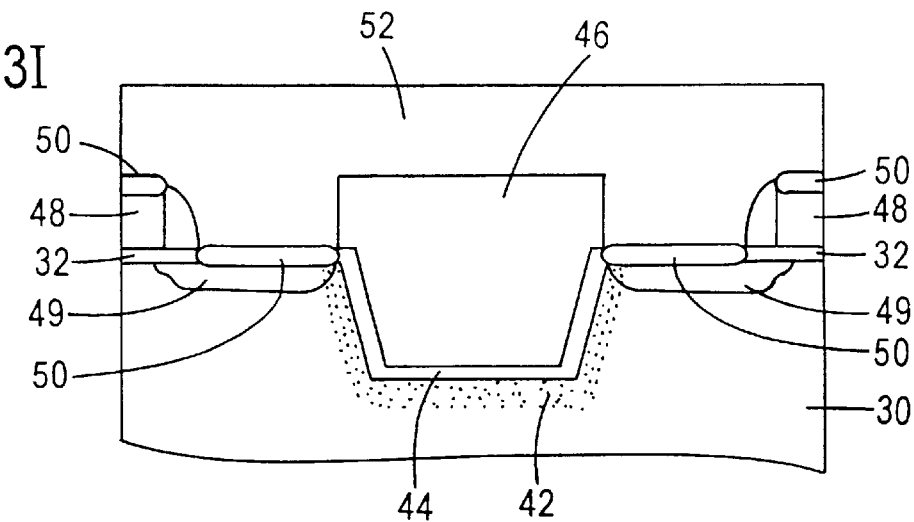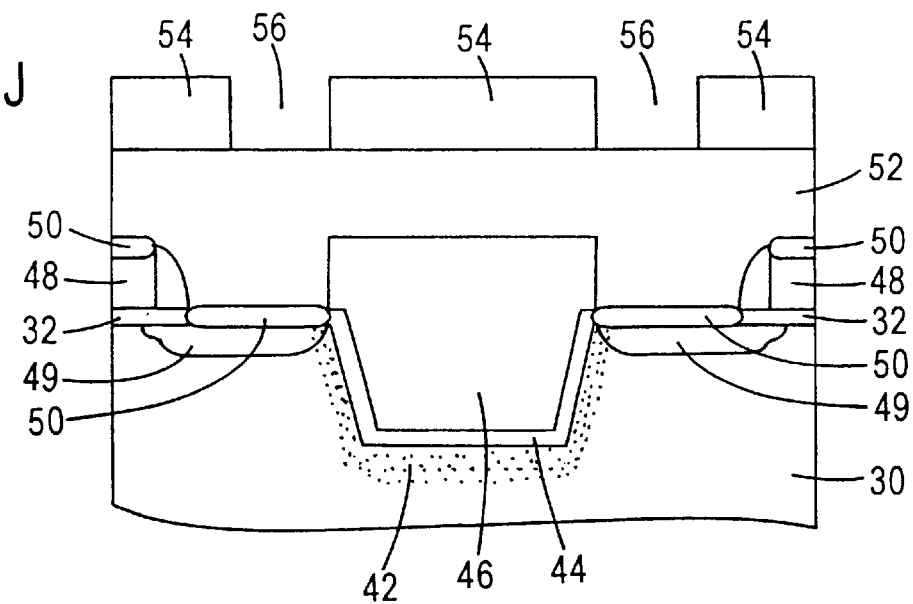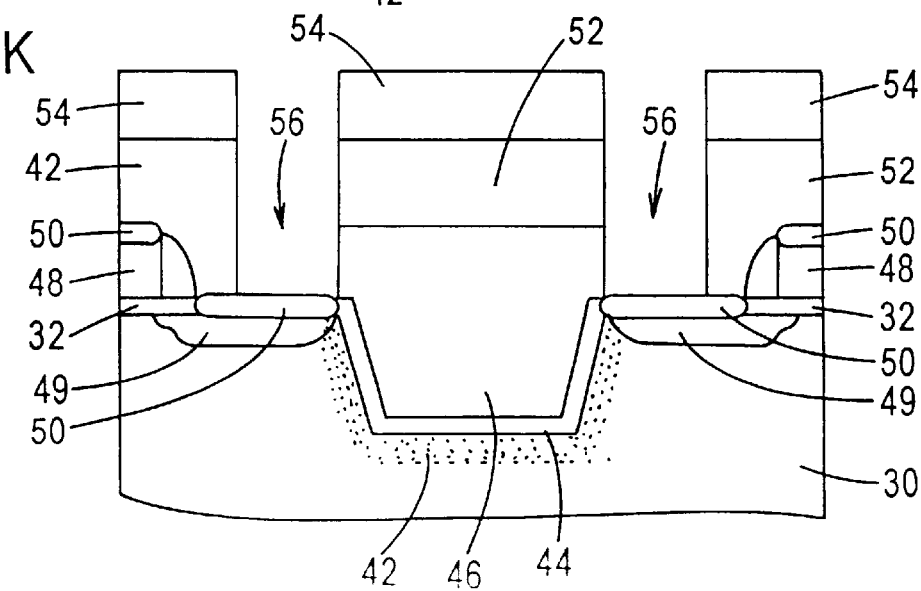

METHOD OF ETCHING CONTACTS WITH REDUCED OXIDE STRESS

FIELD OF THE INVENTION

The present invention relates generally to semiconductor devices and manufacturing processes, and particularly to methods for precisely controlling an etch process to form local interconnect lines.

BACKGROUND OF THE INVENTION

Current demands for high density and performance associated with ultra large scale integration (ULSI) requires submicron features of about 0.25 microns and under, increased transistor and circuit speeds and improved reliability. Such demands for increased density, performance and reliability require formation of device features with high precision and uniformity.

As device features are increasingly miniaturized to increase the integration density, the need for effective isolation between individual devices becomes more critical. For the purpose of effective isolation between electrical devices, various isolation technologies have been introduced. An earlier method known as LOCOS (Local Oxidation of Silicon) was developed for MOSFET devices to prevent the establishment of parasitic channel between adjacent device. The LOCOS isolation technique involves the formation of an oxide bulk in the non-active area on the semiconductor substrate. The well-known drawbacks associated with LOCOS isolation are the formation of the so-called "bird's beak" oxide configuration and the associated encroachment of the field oxide beneath the oxidation mask.

As device dimensions reached submicron size, conventional LOCOS isolation technologies attained the limit of their effectiveness, and alternative isolation techniques were developed to increase the device density. One such isolation technology developed involves a process of creating trench structure during the integrated circuit fabrication. The utilization of trench structures to form isolation areas accomplished several major improvements such as prevention of latch-up and effective isolation of n-well regions from p-doped substrate in CMOS devices.

Typically, trench isolation involves etching a narrow, deep trench or groove in a silicon substrate and then filling the trench with a hard filling material such as silicon oxide. A problem with the use of hard materials is that they may cause dislocations and other defects in the silicon substrate during the subsequent thermal processes due to the differences in rates of thermal expansion between the filler material and the silicon substrate. For example, the trenches typically have contacts between a silicon substrate and silicon dioxide layers formed thereon. Because of the differing thermal coefficients of expansion of silicon and silicon dioxide, a stress problem from the mismatch occurs at the interface between the layers of silicon and silicon dioxide. This stress tends to cause undesirable damage in the silicon substrate near the trefich. Particularly, top edges of the trenches are susceptible to the generation of significant stress defects.

With this in mind, FIG. 1 depicts a cross-section of a portion of a prior art semiconductor device, which comprises a trench liner 12 formed on a silicon substrate 10. Conventionally, trench liner 12 is silicon dioxide formed by a conventional thermal oxidation process, i.e., at an oxidation temperature of 1050° C. or less. During the thermal oxidation process to form silicon dioxide trench liner 12, oxidation stress is formed in interface region 14 within substrate 10 due to the different thermal expansion coefficients of silicon and silicon dioxide.

A trench isolation region 16 has been formed on trench liner 12 by filling the trench with oxide material, typically TEOS. The portion further includes a gate region 18 that is part of a field effect transistor having an active region 20, either a source or drain region, formed adjacent to trench isolation region 16 within substrate 10. Conductive silicide regions 22 have been formed on the top surface of active region 20 and gate region 18. A dielectric material, such as silicon dioxide derived from tetraethyl orthosilicate (TEOS) has been deposited over the substrate 10 to form an interlayer dielectric 24, and then the surface of interlayer dielectric 24 has been planarized. A local interconnection opening 26 has been formed by conventional etching processes, extending through dielectric layer 24 to silicide regions 22. Barrier layer 28 is then formed on the inner surface of local interconnect opening 22.

During the dielectric etching process to form local interconnection opening 22, it is desirable to stop the etching process at the silicide regions 22 formed on active region 20. However, it is often difficult to precisely stop the etching process at the silicide region 22. One reason is that the thermal oxidation process to form trench liner 12 causes undesirable stress defects in an interface region 14 between substrate 10 and trench liner 12, especially near the top edges of the trench isolation region 16. The stress defects in the interface region 14 make it difficult to precisely stop etching interlayer dielectric 24 at silicide region 22. This often causes local interconnect openings to extend through silicide region 22 to substrate 10, thereby-forming a dip 29 in the top surface of interface region 14. Upon filling local interconnect opening 26 with a conductive material to form a local interconnect line, a conductive path is undesirably created between the local interconnect line and substrate 10 through dip 29, thereby resulting in an intolerable amount of leakage current which decreases circuit performance, and in extreme circumstances, may cause failure of the circuit.

Thus, there is a need for a method that substantially reduces the stress defect at the top surface of an interface region between a substrate and a trench liner to prevent undesirable formation of a conductive path between the local interconnect line and the substrate.

SUMMARY OF THE INVENTION

These and other needs are met by the present invention which provides an improved method of forming trench isolation regions on semiconductor substrates. The method comprises the steps of forming a trench of a trench isolation region on a portion of a top surface of a semiconductor substrate, the trench having an inner surface, and depositing a trench liner on the inner surface of the trench by high density plasma (HDP) deposition.

The deposition of a trench liner, such as high temperature HDP oxide, on the inner surface of the trench by HDP deposition, produces a trench liner with low compressive stress since the process is stress neutral. This substantially reduces stress defects in the interface region between the silicon substrate and the liner formed thereon. Spiking of the junction produced during etching at the substrate-liner interface is thereby reduced.

The earlier stated needs are met by another embodiment of the present invention which provides a method of manufacturing a semiconductor device, comprising the steps of forming a trench of a trench isolation region in a portion of a top surface of a semiconductor substrate and depositing oxide as a trench liner in the trench using high density plasma (HDP) deposition. The trench is filled with an insulating material to form a trench isolation region. An active region is formed in the top surface adjacent to the oxide liner and a dielectric layer is deposited over the top surface, active region and trench isolation region. The dielectric layer is then etched to form a local interconnection opening exposing the active region. The trench liner deposited by HDP deposition substantially prevents the local interconnection opening from reaching the substrate between the active region and the trench isolation region. Following the etching, the local interconnection opening is filled with a conductive material.

The local interconnect formed by the methods of the present invention does not have an undesirable conductive path between the local interconnect line and the substrate through the trench liner. This is due to the substantially reduced stress defects at the top surface of the interface region between the substrate and the trench liner produced by the HDP deposition of the oxide trench liner.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which;

FIG. 3I depicts the portion of FIG. 3H following a dielectric deposition process in which an interlayer dielectric is formed over the entire substrate and the surface of the interlayer dielectric is planarized;

FIG. 3J depicts the portion of FIG. 3I following a photoresist deposition process in which the photoresist layer is formed and patterned to expose portions of the interlayer dielectric;

FIG. 3K depicts the portion of FIG. 3J following an interlayer dielectric etch process to form a plurality of local interconnect openings extending through the dielectric to the silicide layers, without extending to the substrate.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-section portions of an integrated circuit device during fabrication are not drawn to scale, but instead are drawn to illustrate the feature of the present invention.

The present invention addresses and reduces problems associated with controlling an etch process to form local interconnect lines, caused by stress defects in the interface region of a silicon substrate on which a thermal oxide layer is conventionally formed. The stress defects made it difficult to precisely stop etching and would therefore allow a local interconnect opening to extend into the substrate and a conductive path to be formed between the local interconnect line and the substrate. The invention alleviates these problems by depositing a trench liner by high density plasma (HDP) deposition. In certain embodiments, the trench liner is high temperature HDP oxide that is deposited at a temperature of approximately 600° C. to 700° C. Since this is a stress neutral process, the trench liner exhibits low compressive stress, and spiking of the junction is reduced.

Figure 1:
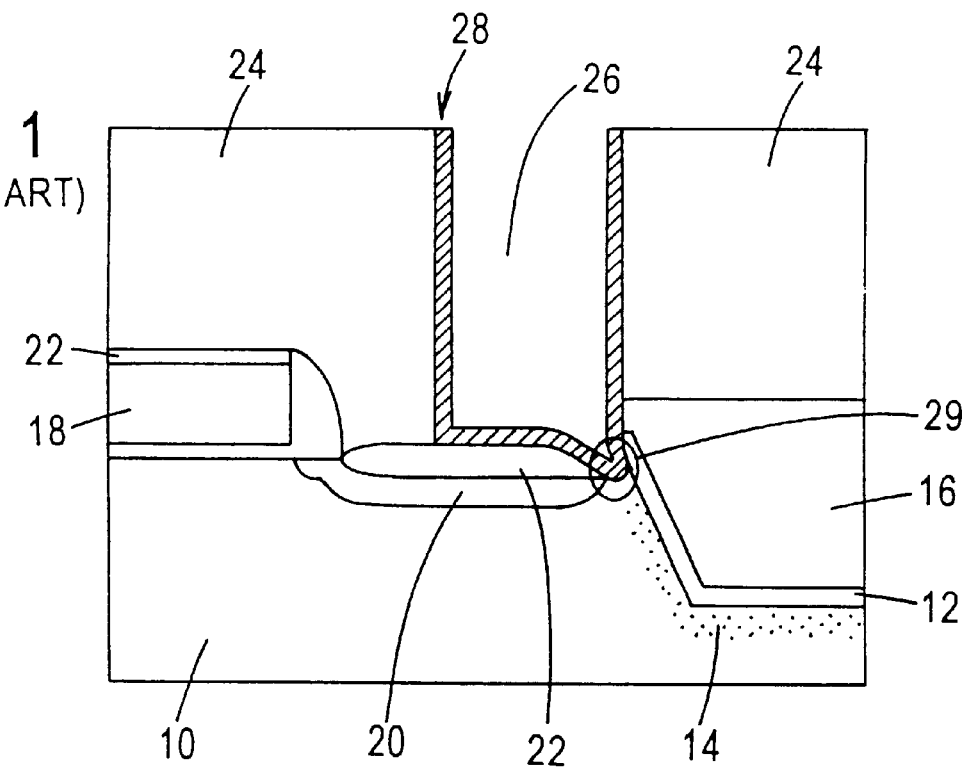
FIG. 1 depicts a cross-section of a portion of a prior art semiconductor wafer in which a local interconnect opening is over-etched, extending to a silicon substrate between a trench isolation region and an active region.
Figure 2:
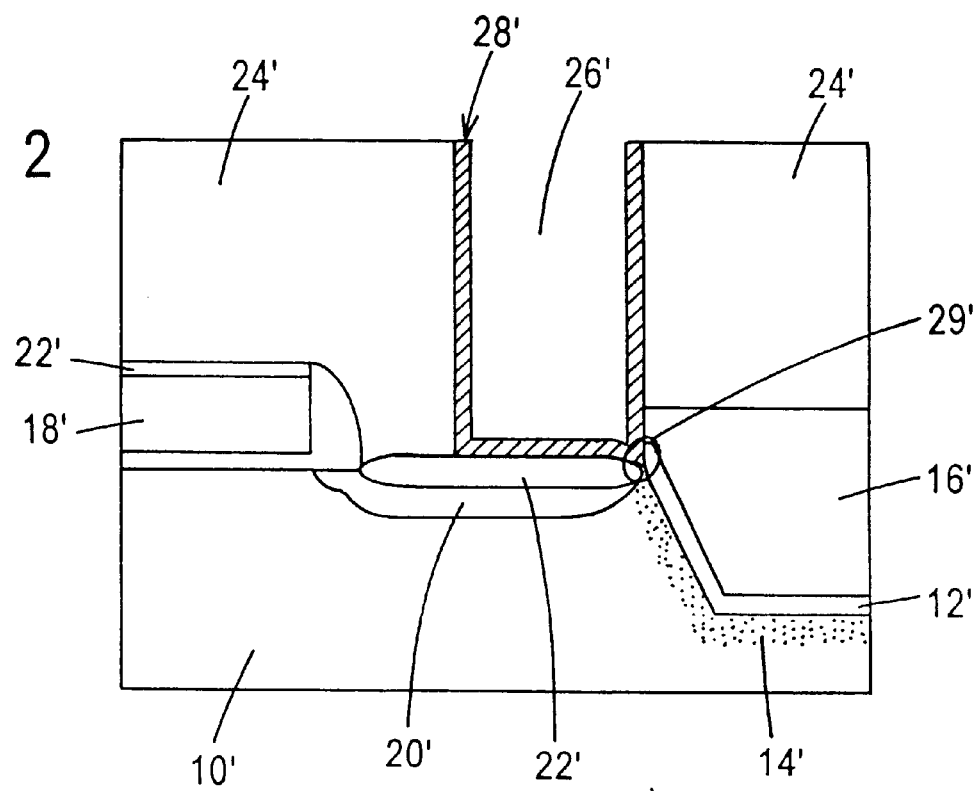
FIG. 2 depicts a cross-section of a portion of a semiconductor wafer, in accordance with an embodiment of the present invention, in which a local interconnect opening is extending to a silicide layer.

Accordingly, as shown in FIG. 2, the present invention enables a precise etch control to form a local interconnection opening 26' which extends only to a silicide layer 22' without extending to the top portion of an interface region 14 of a substrate 10', thereby eliminating the leakage current problem.

Figure 3A:
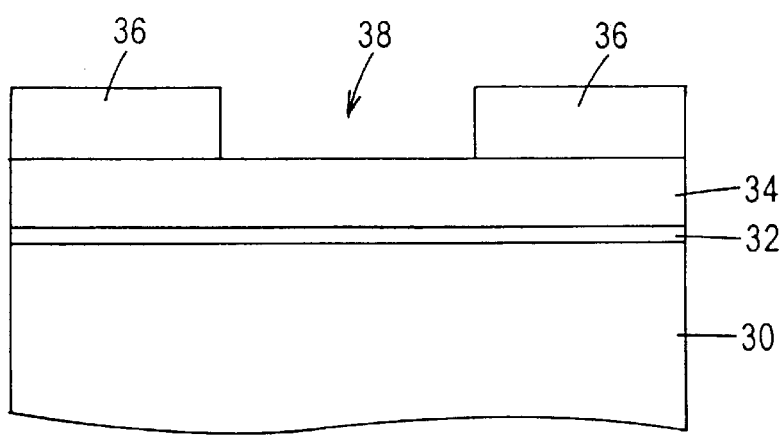
FIG. 3A depicts a cross-section of a portion of a semiconductor wafer, in accordance with an embodiment of the present invention, that has a silicon substrate, a pad oxide, a polish stop layer and a patterned photoresist layer.

With this in mind, FIG. 3A depicts a cross-section of an improved portion of a semiconductor wafer in accordance with an exemplary embodiment of the present invention. A pad oxide layer 32 is formed on a silicon substrate 30, followed by a polish stop layer 34 such as a nitride layer. A photoresist layer 36 is formed on the polish stop layer 34 and then patterned to expose portions of the polish stop layer 34, thereby forming a mask-defining first opening 38.

Figure 3B:
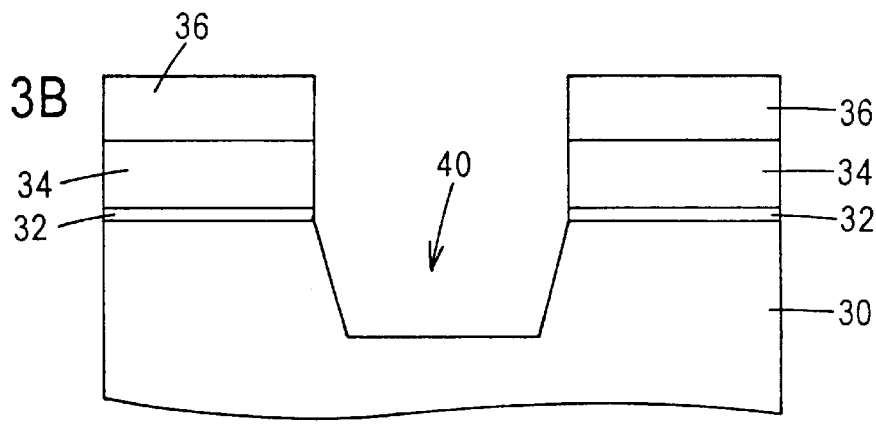
FIG. 3B depicts the portion of FIG. 3A following an etching process to form a trench, in accordance with an embodiment of the present invention, which extends from the polish stop layer through the pad oxide layer to the silicon substrate.

In FIG. 3B, the semiconductor wafer is placed within an etching tool and a conventional trench etching process is performed to remove the portions of the polish stop layer 34, the pad oxide layer 32, and the silicon substrate 30 that are located below the first opening 38, thereby forming a trench opening 40 within the silicon substrate 30.

Figure 3C:
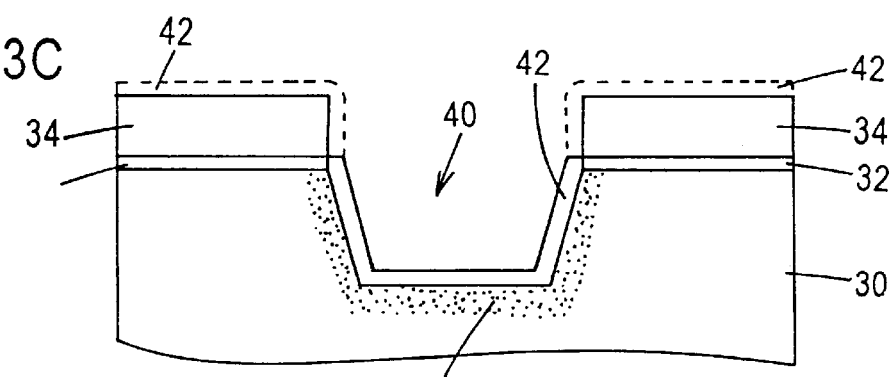
FIG. 3C depicts the portion of FIG. 3B following a high density plasma (HDP) deposition to form a trench liner on the inner surface of the trench, in accordance with an embodiment of the present invention.

In FIG. 3C, the photoresist layer 36 is removed from the surface of the polish stop layer 34, and the wafer is subjected to a high density plasma (HDP) process to form an oxide trench liner 42 on the inner surface of the trench opening 40. Trench liners are normally formed to reduce the degradation of substrate quality caused by directly depositing a trench filling material to fill the trench. In accordance with the present invention, the wafer is placed in a HDP chamber to deposit the high temperature HDP oxide.

An exemplary HDP process recipe for the present invention includes power settings for the HDP chamber as follows: the top power is set at approximately 1000W to 2000W; the side power is set at approximately 2500W to 3900W; aid the bias power is set at approximately 2000 to 4000W. The flow of gas supplied to the chamber includes argon (Ar) supplied at approximately 50–100 sccm and Ar is supplied at the top of the chamber with a flow rate of approximately 5–20 sccm. Oxygen ($O_2$) is supplied to the chamber at a flow of approximately 100–400 sccm, and $O_2$ is supplied to the top of the chamber at a flow rate of approximately 10–50 sccm. Silane ($SiH_4$) is provided at a flow rate of approximately 50–200 sccm, and silane is provided at the top of the chamber at a flow rate of approximately 10–20 sccm. The temperature range with the chamber during the HDP deposition is between about 500° C. to about 800° C. with a preferred range of about 600° C. to about 700° C.

After the HDP deposition, the trench liner 42 is exposed to oxygen ambient, which causes densification of the oxide trench liner 42. The densification process will grow about 100 to 200 Angstroms of thermal oxide under HDP.

The high temperature HDP oxide process offers low compressive stress since it is stress neutral. This reduces stress defects in the interface region 44 of the silicon substrate 30.

Figure 3D:
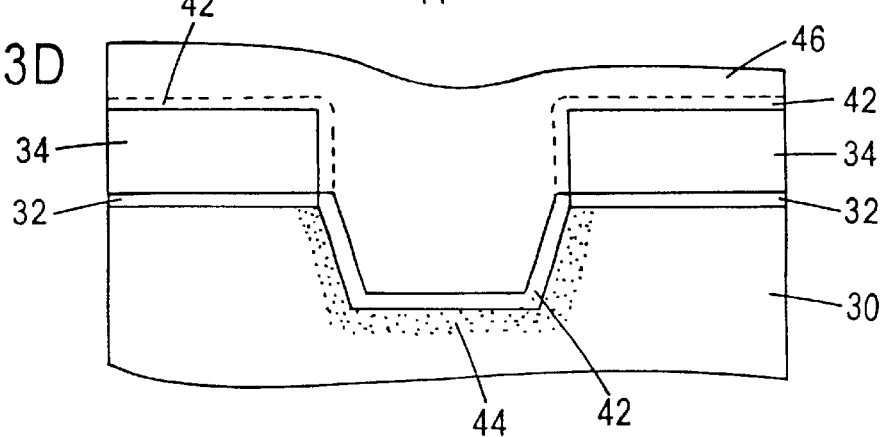
FIG. 3D depicts the portion of FIG. 3C following a dielectric layer deposition process to fill the trench.

In FIG. 3D, a trench filling material 46 is deposited over the substrate 30 to fill the trench opening 40 covered by the oxide liner 42. Typically, the trench filling material 46 is formed by depositing a dielectric material, such as, for example, silicon dioxide derived from tetraethyl orthosilicate (TEOS).

Figure 3E:
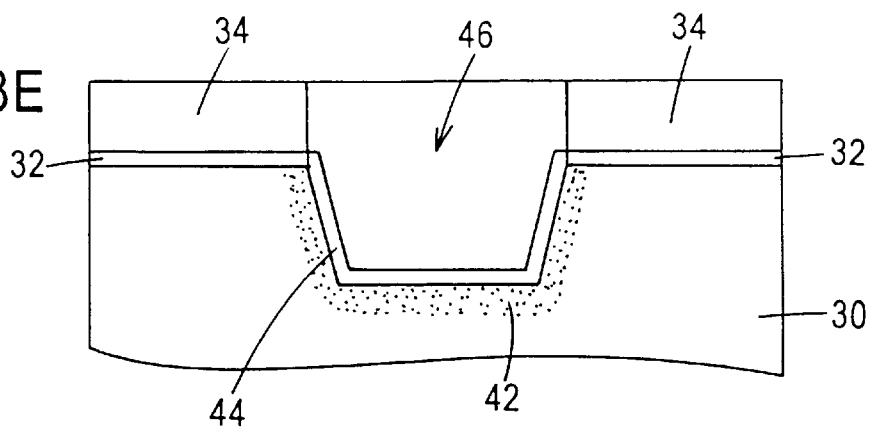
FIG. 3E depicts the portion of FIG. 3D following a polishing process.
Figure 3F:
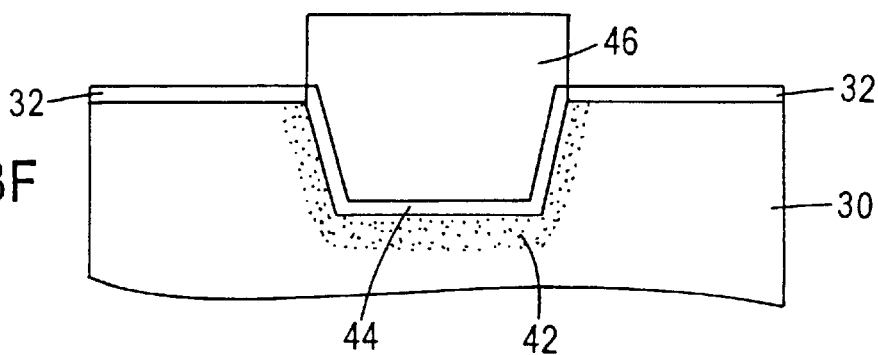
FIG. 3F depicts the portion of FIG. 3E following removal of the polishing stop layer.

In FIG. 3E, the top surface of the trench filling material 46 is planarized, by conventional chemical mechanical polishing techniques, for example. The planarizing step continues until the polish stop layer 34 is exposed, so that a trench isolation region 46 is formed between the polish stop layer 34. Then, as depicted in FIG. 3F, the polish stop layer 34 is removed.

Figure 3G:
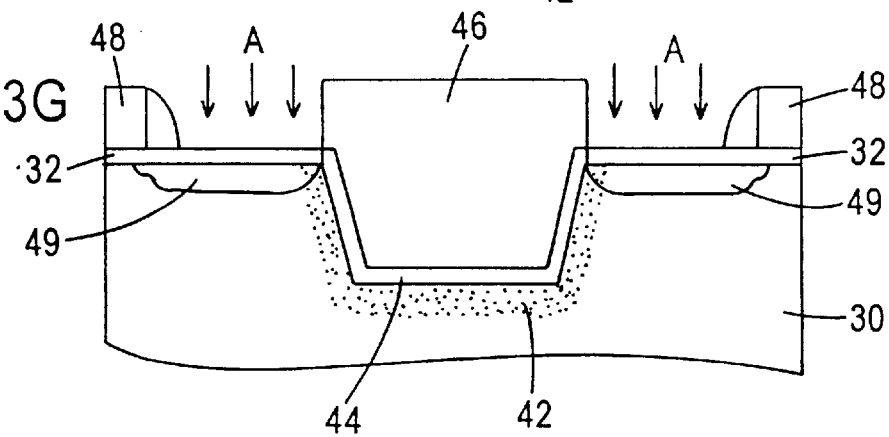
FIG. 3G depicts the portion of FIG. 3F during a MOSFET device formation process in which a gate electrode and sidewall spacers are formed on the substrate and an impurity is introduced into the surface of the substrate to form active regions.

In FIG. 3G, a plurality of gate oxides 48 are formed over the pad oxide layer 32, and then an ion implantation process is performed to form a plurality of active regions 49 as shown by arrows A. Typically, active regions 49 are formed by self-alignment ion implantation without forming a mask layer because gate region 48 and trench isolation region 46 function as a mask. Therefore, active regions 49 are typically formed in the exposed gap of silicon substrate 30 between gate electrodes 48 and trench isolation region 46.

Figure 3H:
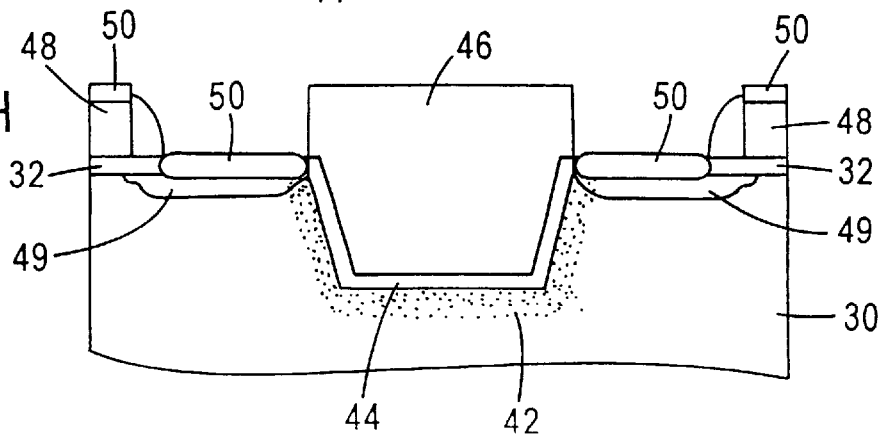
FIG. 3H depicts the portion of FIG. 3G following a silicide formation process in which silicide layers are formed over the gate regions and active regions.

In FIG. 3H, conductive silicide 50 is deposited selectively on the gate electrodes 48 and active regions 49 by well-known salicide (self-aligned silicide) techniques, to provide the gate electrode 48 and active regions 49 with reduced contact resistance.

In FIG. 3I, a dielectric material, such as TEOS, is deposited over the entire surface of the substrate 30, and then planarized to form an interlayer dielectric 52.

In FIG. 3J, a photoresist layer 54 is formed over the planarized interlayer dielectric 42 and then patterned to expose portions of the interlayer dielectric 42, thereby forming mask-defining second openings 56.

In FIG. 3K, the semiconductor substrate is placed in an etching tool and a conventional local interconnect etching process is performed to remove the portion of the interlayer dielectric 52 that are located below the second openings 56, thereby forming local interconnect openings 56 within the interlayer dielectric 52. The etchant comprises, in preferred embodiments, CF4, Ar, or CHF3, for example. Since the stress defect problem of the interface region 42 has been significantly reduced by the previous thermal oxidation process according to the present invention, it is possible to precisely form the local interconnection openings 56 which extend only to the silicide layer 50.

Figure 3L:
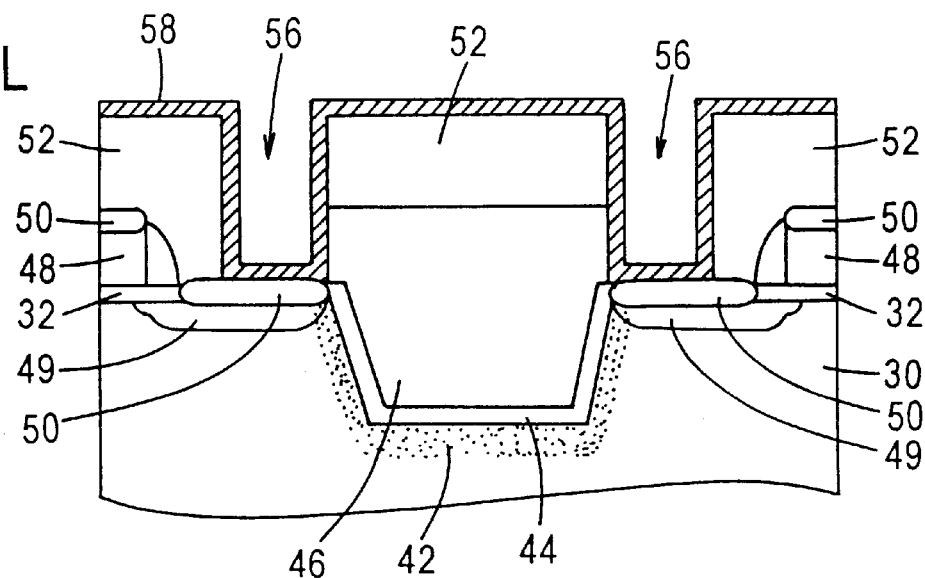
FIG. 3L depicts the portion of FIG. 3K after forming a conductive glue layer on the surfaces of the local interconnect openings.

In FIG. 3L, a conductive "glue" layer 58 is formed over the interlayer dielectric 52 and the inner surfaces of the local interconnect openings 56. For example, the glue layer 58 includes titanium/titanium nitride (Ti/TiN).

Figure 3M:
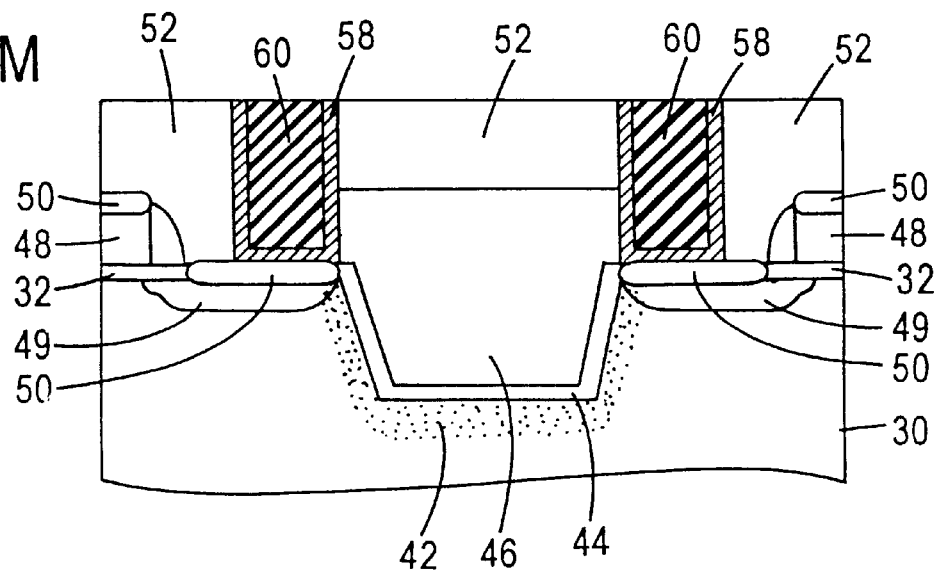
FIG. 3M depicts the portion of FIG. 3L following a conductive material deposition process to fill the local interconnect openings.

In FIG. 3M, the local interconnect openings 56 are filled by a conductive material, such as titanium, tungsten, or titanium nitride, thereby forming conductive plugs 60 which provide conductive paths to the active regions 50.

The methods of the present invention increase the process control and the yield, as the conventional thermal oxidation processes to form an oxide layer on a silicon substrate are avoided since this results in stress defects in the interface region. By depositing high temperature HDP oxide as a trench liner, which involves a stress neutral process, there is a low compressive stress associate with the trench liner and the interface, so that stress defects leading to junction spiking are avoided with the present invention.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method for manufacturing semiconductor devices, comprising the steps of:

forming a trench of a trench isolation region on a portion of a top surface of a semiconductor substrate, the trench having an inner surface; and depositing a thermal liner on the inner surface of the trench by high density plasma (HDP) deposition;

wherein the thermal liner is oxide; and further comprising maintaining a chamber temperature of approximately 500° C. to approximately 800° C. during the depositing of the thermal liner.

2. The method of claim 1, wherein the HDP deposition is performed in a HDP deposition chamber, employing a top power between approximately 1000 W to approximately 2000 W, a side power between approximately 2500 W to about 3900 W and a bias power of about 2000 W to about 4000 W.

3. The method of claim 2, wherein the step of depositing a thermal liner includes supplying to the HDP deposition chamber: Ar at approximately 50–100 sccm, top Ar at approximately 5–20 sccm, $O_2$ at approximately 100–400 sccm, top $O_2$ at approximately 10–50 sccm, $SiH_4$ at approximately 50–200 sccm, and top $SiH_4$ at approximately 10–20 sccm.

4. The method of claim 3, further comprising densifying the thermal liner following the deposition of the thermal liner.

5. The method of claim 4, wherein the step of densifying includes exposing the thermal liner to an oxygen ambient.

6. A method for manufacturing semiconductor devices, comprising the steps of:

forming a trench of a trench isolation region on a portion of a top surface of a semiconductor substrate, the trench having an inner surface; and depositing a thermal liner on the inner surface of the trench by high density plasma (HDP) deposition;

wherein the thermal liner is oxide; and further comprising maintaining a chamber temperature of approximately 600° C. to approximately 700° C. during the depositing of the thermal liner.

7. The method of claim 6, wherein the HDP deposition is performed in a HDP deposition chamber, employing a top power between approximately 1000 W to approximately 2000 W, a side power between approximately 2500 W to about 3900 W and a bias power of about 2000 W to about 4000 W.

8. The method of claim 7, wherein the step of depositing a thermal liner includes supplying to the HDP deposition chamber: Ar at approximately 50–100 sccm, top Ar at approximately 5–20 sccm, $O_2$ at approximately 100–400 sccm, top $O_2$ at approximately 10–50 sccm, $SiH_4$ at approximately 50–200 sccm, and top $SiH_4$ at approximately 10–20 sccm.

9. The method of claim 8, further comprising densifying the thermal liner following the deposition of the thermal liner.

10. The method of claim 9, wherein the step of densifying includes exposing the thermal liner to an oxygen ambient.

11. A method of manufacturing a semiconductor device, comprising the steps of:

forming a trench of a trench isolation region in a portion of a top surface of a semiconductor substrate;

depositing oxide as a trench liner in the trench using high density plasma (HDP) deposition;

filling the trench with an insulating material to form a trench isolation region;

forming an active region in the top surface adjacent to the oxide liner;

depositing a dielectric layer over the top surface, active region and trench isolation region;

etching the dielectric layer to form a local interconnection opening exposing the active region, wherein the trench liner deposited by HDP deposition substantially prevents the local interconnection opening from reaching the substrate between the active region and the trench isolation region; and filling the local interconnection opening with a conductive material.

12. The method of claim 11, wherein the HDP deposition is performed in a HDP deposition chamber and further comprising maintaining a chamber temperature of approximately 600° C. to approximately 700° C. during the depositing of the thermal liner in the HDP deposition chamber.

13. The method of claim 12, wherein the depositing includes applying in the HDP chamber a top power of approximately 1000 W to approximately 2000 W, a side power of approximately 2500 W to about 3900 W and a bias power of about 2000 W to about 4000 W.

14. The method of claim 13, wherein the step of depositing a thermal liner includes supplying to the HDP deposition chamber: Ar at approximately 50–100 sccm, top Ar at approximately 5–20 sccm, $O_2$ at approximately 100–400 sccm, top $O_2$ at approximately 10–50 sccm, $SiH_4$ at approximately 50–200 sccm, and top $SiH_4$ at approximately 10–20 sccm.

* * * * *